United States Patent [19]

Avery

[11] Patent Number: 4,484,244
[45] Date of Patent: Nov. 20, 1984

[54] PROTECTION CIRCUIT FOR INTEGRATED CIRCUIT DEVICES

[75] Inventor: Leslie R. Avery, Flemington, N.J.

[73] Assignee: RCA Corporation, New York, N.Y.

[21] Appl. No.: 421,517

[22] Filed: Sep. 22, 1982

[51] Int. Cl.³ .................... H02H 9/00; H02H 9/04; H02H 3/22

[52] U.S. Cl. .................................. 361/56; 361/91; 361/111

[58] Field of Search ............... 361/56, 91, 110, 111, 361/93, 98; 357/39, 44

[56] References Cited

U.S. PATENT DOCUMENTS

| 3,401,319 | 9/1968 | Watkins | 317/235 |
|---|---|---|---|
| 3,573,550 | 4/1971 | Baker | 317/16 |
| 3,967,207 | 6/1976 | Wheatley, Jr. | 361/98 |
| 4,080,616 | 3/1978 | Horie | 357/13 |
| 4,114,072 | 9/1978 | Willis | 315/411 |
| 4,264,941 | 4/1981 | London | 361/91 |
| 4,288,830 | 9/1981 | Brasfield | 361/56 |

FOREIGN PATENT DOCUMENTS 2951421 12/1979 Fed. Rep. of Germany .
877040 9/1961 United Kingdom .
1191763 5/1970 United Kingdom .
1288383 9/1972 United Kingdom .
2090701 7/1982 United Kingdom .
2095909 10/1982 United Kingdom .

OTHER PUBLICATIONS

Patent Application: L. R. Avery; Protection Circuit for Integrated Circuit Devices; Filed 12-3-80; S.N. 212,534; Filed 12-1-81; S.N. 326,219.
"IBM Technical Disclosure Bulletin", G. C. Feth et al., vol. 19, No. 6, Nov. 1976, pp. 2297-2301.

Primary Examiner—E. A. Goldberg
Assistant Examiner—Patrick W. Foster
Attorney, Agent, or Firm—Birgit E. Morris; Donald S. Cohen; Lawrence P. Benjamin

[57] ABSTRACT

A pair of protection circuits, each forming a silicon controlled rectifier (SCR) for protecting a circuit against either negative or positive voltage transients, are formed in a single isolated region together with a bond pad. A second embodiment also includes a sense resistor in the isolated region.

8 Claims, 7 Drawing Figures

PROTECTION CIRCUIT FOR INTEGRATED CIRCUIT DEVICES

FIELD OF THE INVENTION

This invention relates, in general, to protection circuits and, more particularly, to protection circuits for integrated circuit devices.

BACKGROUND OF THE INVENTION

It is well-known that integrated circuits (IC) are often damaged by voltage transients which overload one or more individual devices contained within the IC, resulting in melting, short circuiting or otherwise destroying the device. In the past, various devices and circuits have been employed to protect the IC's and to thereby prevent its destruction by such transients. These protection devices have taken the form of either diodes or transistor circuits that have been included on the chip for internal transient protection. While such devices provide some measure of protection for the IC in which they are included, it has been found that they occupy large areas which might otherwise be used for circuitry and thus enhance the packing density.

One example of a transient is a high voltage spike that may occur in a television receiver which contains low voltage IC's for, for example, video and audio processing. Typically, the anode of a picture tube is biased to about 25,000 volts and if the high voltage anode is rapidly discharged, a high voltage transient will appear at the power supply. Arcing in the picture tube may also unpredictably occur between the anode and one or more of the low potential electrodes. In either event, the high voltage transient which may have either a positive going or a negative going peak in excess of 100 volts, is applied to the IC terminal through the common power supply or by electrostatic pickup on the connecting conductors of a printed wiring board.

Still another cause of high voltage transients in a television receiver is electrostatic discharge. A build-up of electrostatic charge is usually discharged by the user through the television receiver controls to produce a high voltage transient which may damage IC's in the television receiver.

While there are many high voltage transient protection devices available to the design engineer, he is faced with the problem of having to use valuable chip space for forming the bulky protection devices. On devices containing a large number of pins, it has been found that the protection devices occupy a significant space and, therefore, the chip becomes unduly large and is thus undesirable.

SUMMARY OF THE INVENTION

The present invention is embodied in an IC protection circuit comprising first and second pairs of compementary conductivity transistors formed in a common N-well. In one embodiment a resistive element is integral with the semiconductor structure to constitute a sensing element. In all described embodiments, each pair of complementary conductivity transistors (and the common sense resistor) are arranged in a common isolated region and each pair of transistors is connected to form a two terminal device capable of conducting a high current when the voltage transient (either negative or positive) exceeds a predetermined value.

DETAILED DESCRIPTION OF THE INVENTION

Figure 1:
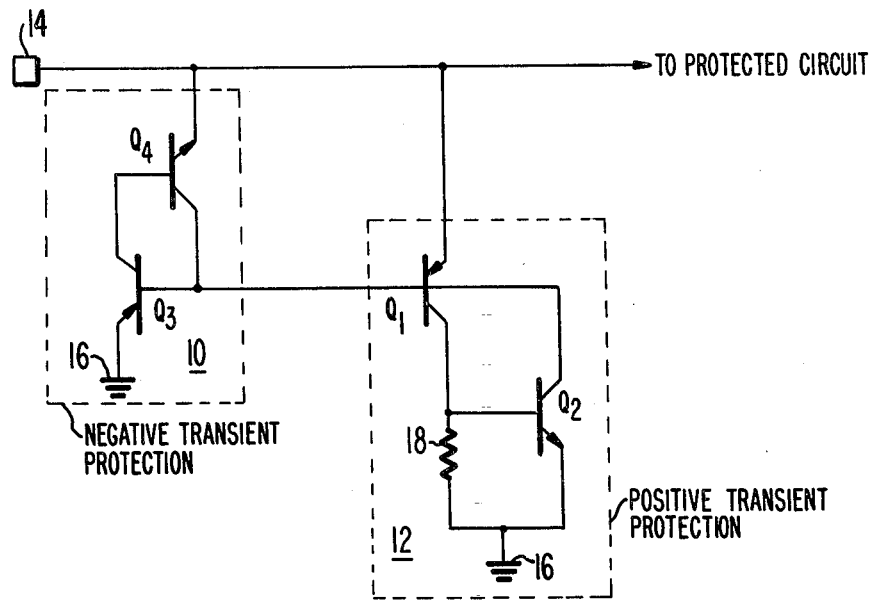
FIG. 1 is a schematic diagram of one embodiment of a dual polarity transient protection circuit embodied in my novel invention.

Referring now to FIG. 1, wherein the circuit to be protected is shown protected from negative going transients by circuit 10 and from positive going transients by circuit 12, both the negative and the positive transient protection circuits 10 and 12 being formed in a common isolated region or boat.

Circuit 10 consists of an NPN transistor $Q_4$ having its emitter connected to the conductor that carries a signal between pad 14 and the protected circuit (not shown). The collector of transistor $Q_4$ is connected to the base of PNP transistor $Q_3$ while the base of transistor $Q_4$ is connected to the collector of transistor $Q_3$. The emitter of transistor $Q_3$ is connected to a source of reference potential such as the substrate or ground 16. Thus, negative transient protection is provided by a pair of transistors, interconnected and functioning as a two-terminal silicon control rectifier (SCR).

Positive transient protection circuit 12 consists of a PNP transistor $Q_1$ having its emitter connected to the conductor that carries the signal between terminal 14 and the protected circuit. The collector of transistor $Q_1$ is connected to the base of NPN transistor $Q_2$ while the base of transitor $Q_1$ is connected to both the collector of transistor $Q_2$ and the base of transistor $Q_3$. The base of transistor $Q_2$ is connected to the substrate 16 through a low value resistor 18 and, to complete the device, the emitter of transistor $Q_2$ is also connected to the substrate 16.

The operation of protection circuit 10, for a negative going transient pulse appearing at terminal 14, is somewhat similar to that of an SCR except that circuit 10 is constructed as a two terminal device. This distinguishes over the conventional SCR by reason of the fact that a conventional SCR is a three terminal device designed to avoid triggering based on either the voltage between its anode and cathode or upon the rate of change of voltage between its anode and cathode. The negative transient protection circuit of my device will be triggered by either a high voltage transient appearing across terminals 14 and 16 or by a high rate of change of voltage (dv/dt) across the two terminals 14 and 16. In practice, terminal 16 is a source of reference potential such as substrate or ground potential while terminal 14 is connected to the circuitry to be protected. Accordingly, if terminal 14 goes negative with respect to ground at a high rate, the protection circuit 10 will be turned on (terminals 14 and 16 will be electrically connected) causing the excess current to be passed to ground. As distinguished from the present circuit, a conventional SCR would have a low value resistor connected between the base and emitter of transistor $Q_4$ and/or transistor $Q_3$ which would prevent such firing. In the event that there is a slow change of voltage at terminal 14, a very small current, in the order of picoamps, will flow through transistor $Q_4$ without causing the circuit to latch, since the total loop gain has been selected to be less than 1. However, when the negative going voltage appearing at terminal 14 becomes sufficiently negative, transistor $Q_4$ becomes heavily conductive to thereby provide sufficient loop gain to insure that the total loop gain is greater than 1. Again, the entire protection circuit becomes conductive and passes any excess current to ground.

Referring now to positive transient protection circuit 12, it will be seen that this circuit also differs from a conventional SCR in that the interconnections of transistors $Q_1$ and $Q_2$ are such as to convert the prior art three terminal SCR device into a two terminal device that is rendered conductive when the voltage across its terminals exceeds a predetermined positive threshold. In operation, it is assumed that transistors $Q_1$ and $Q_2$ are initially non-conductive in which event, resistor 18 prevents both electrical and thermal noise from inadvertently causing transistors $Q_1$ and $Q_2$ to become conductive. Basically, the operation of protection circuit 12 is triggered by the collector-base breakdown of transistor $Q_2$ during an excursion of a positive going transient causing a voltage drop across resistor 18. When this voltage drop exceeds one $V_{BE}$ (about 0.7 volts) transistor $Q_2$ is turned on. This provides sufficient base current for transistor $Q_1$ to be driven into conduction causing a positive feedback effect driving both transistors $Q_1$ and $Q_2$ into saturation effectively clamping pad 14 to ground.

Figure 2:
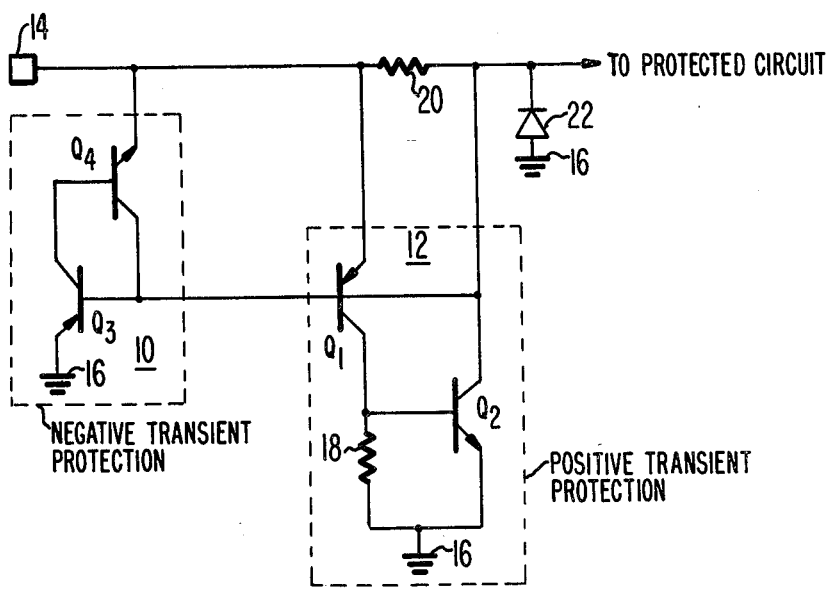
FIG. 2 is a schematic diagram of another embodiment of a dual polarity transient protection circuit embodied in my invention.

Referring now to FIG. 2 there is shown negative and positive going transient protection circuits 10 and 12. It should be noted that similar elements will be similarly numbered. In this regard, negative transient protection circuit 10 of this figure is interconnected in a manner similar to that of the negative transient protection circuit 10 of FIG. 1 while the positive transient protection circuit 12 has transistors $Q_1$ and $Q_2$ that are interconnected in a manner similar to that previously described with regard to positive transient protection circuit 12 of FIG. 1. However, this embodiment includes a sense resistor 20 in series between terminal 14 and the circuit to be protected, with emitter of the NPN transistor $Q_4$ in the negative transient protection circuit 10 and the emitter of the PNP transistor $Q_1$ of the positive transient protection circuit 12 being connected to the end of resistor 20 connected to terminal 14 while the bases of transistors $Q_1$ and $Q_3$ together with the collectors of transistors $Q_2$ and $Q_4$ are connected to the side of resistor 20 connected to the protected circuit. In addition, there is shown a diode 22 connected between the protected circuit and ground 16 which is inherent in the structure.

In operation, a high voltage negative going transient appearing at terminal 14 causes current to flow through resistor 20 and diode 22 in such a direction as to forward bias diode 22. This bias potential is coupled to the emitter-base junction of transistor $Q_3$ via the common connection of the base of transistor $Q_1$ and the base of transistor $Q_3$. Hence, the combination of diode 22 and transistor $Q_3$ effectively form a current mirror. Base current in transistor $Q_3$ causes collector current to flow in transistor $Q_3$, which collector current then flows into the base of transistor $Q_4$. This causes collector current to flow into transistor $Q_4$, augmenting the base current of transistor $Q_3$. The net result is a positive feedback circuit which drives transistors $Q_3$ and $Q_4$ into saturation to effectively clamp terminal 14 to ground potential by the SCR action of transistors $Q_3$ and $Q_4$. When the transient has run its course, or falls below a predetermined value, the potential at terminal 14 returns to its normal functioning potential and current through both diode 22 and negative transient protection circuit 10 ceases and circuit 10 returns to its open state.

A high voltage positive going transient, will also cause current to flow through resistor 20, either into the protected circuit, or as a result of the collector-base breakdown voltage of transistor $Q_2$. When the current flowing through resistor 20 causes one $V_{BE}$ (about 0.7 volts) to appear across its terminals, transistor $Q_1$ will be turned on since this voltage is effectively applied between the base and emitter of transistor $Q_1$. Collector current from transistor $Q_1$ flows through resistor 18 and develops a voltage thereacross and, when this voltage exceeds one $V_{BE}$ (about 0.7 volts), transistor $Q_2$ is turned on. Collector current into transistor $Q_2$ now augments the initial base current of transistor $Q_1$, causing a positive feedback effect which drives both transistors $Q_1$ and $Q_2$ into saturation to effectively clamp terminal 14 to ground potential by the SCR action of transistors $Q_1$ and $Q_2$. When the positive going transient has run its course and/or returns to a point below a predetermined level, circuit 12 will be rendered non-conductive since there is inadequate current flowing through resistor 20 to maintain one $V_{BE}$ for transistor $Q_1$.

It should be noted that circuit 12 will have the clamping action when current flows from terminal 14 to the circuit to be protected but no clamping action will occur when the current flows from the protected circuit to terminal 14 since the polarity of the potential appearing across resistor 20 will tend to reverse bias the emitter base junction of transistor $Q_1$, thus turning it off.

This represents a considerable advantage over the prior art SCR protection circuits since an NPN emitter follower output circuit, which is being protected by the subject invention, may be clamped to ground by the subject invention during transients without damaging the protected emitter follower due to excessive current that may be passed through the emitter follower causing latch up in the protection circuit.

Figure 3:
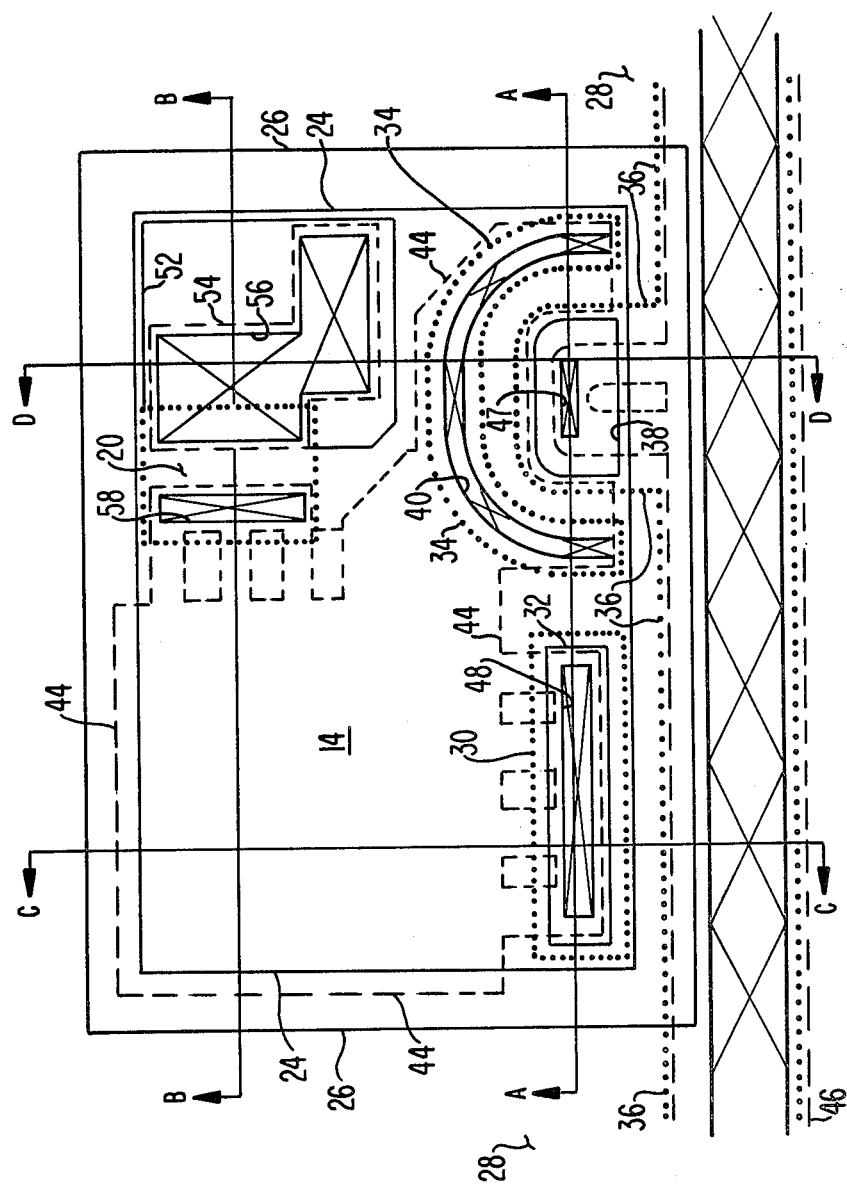
FIG. 3 is a plan view of the structure of the dual polarity transient protection structure of FIG. 2.

Referring now to FIG. 3 which is a plan view of the embodiment of FIG. 2, it will be seen that both the negative transient protection circuit 10 (FIGS. 1 and 2) and the positive transient circuit 12 (FIGS. 1 and 2) are formed in a common N− isolated region 26 together with bond pad or signal terminal 14. In this figure, the dashed lines 44 trace the outline of the metal layer forming the surface of input bond pad 14 as well as the connections to the emitter of transistors $Q_1$ and $Q_4$ to pad 14 and to one end of resistor 20. The solid line labelled 26 traces the outline of the common N− isolated region 26 while the line labelled 24 indicates the limits of the N+ buried pocket or region 24. 28 represents the P+ isolation surrounding N− region 26 while the dotted lines represents various P regions such as 30, 34, 36, and 20.

The solid lines within the dotted lines indicate N+ diffusion regions formed within the P diffusion regions and are here shown, for example, as N+ region 32 formed within P region 30, and N+ region 38 formed within a portion of P region 36. The portions marked with X's represent contact openings in insulation layer 42 and are here shown as 40, 47, 48, 56, and 58.

Referring now to FIGS. 3 and 3A-3D, it will be seen how the various elements of my invention are formed on and in a single isolated boat or region to perform the function of both negative and positive transient protection. For example, the negative transient protection SCR of FIGS. 1 and 2 consisting of PNP transistor $Q_3$ and NPN transistor $Q_4$ may best be seen in FIG. 3, 3A and 3C where N+ region 32 is the emitter, P region 30 is the base and N− region 26 is the collector. These represent the elements of transistor $Q_4$. Similarly, transistor $Q_3$ may also be seen in FIGS. 3 and 3C where P region 36 is the emitter, N− region 26 is the base and P region 30 is the collector. Thus, since N− region 26 is common to both the base of transistor $Q_3$ and the collector of transistor $Q_4$, they are considered as being connected electrically. Similarly, since P region 30 is common to both the collector of transistor $Q_3$ and the base of transistor $Q_4$ they are also connected together. Since the emitter of transistor $Q_4$ (N+ region 32) is connected to bond pad 14 through contact opening 48 in insulation layer 42 and since the emitter of transistor $Q_3$ (P region 36) is connected to ground through metallization 46, the circuit requirments to form the negative transient protection circuit 10 (FIGS. 1 and 2) are met.

Figure 3A:
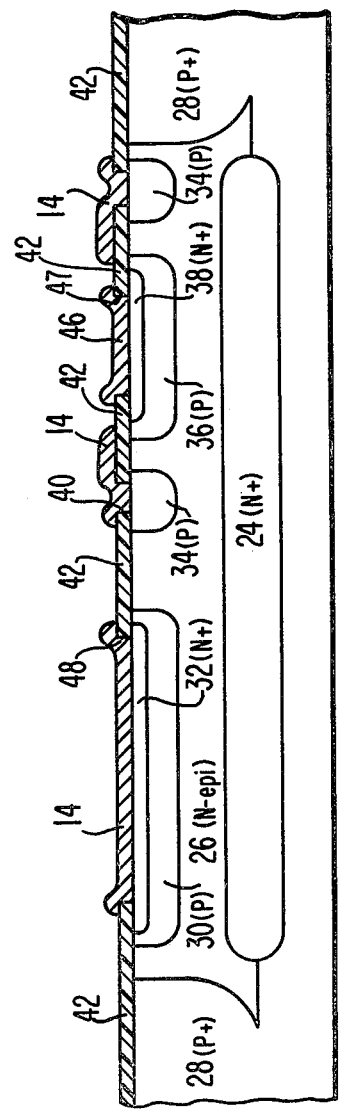
FIG. 3A is a sectional view of the dual polarity transient protection structure taken along lines A—A of FIG. 3.
Figure 3B:
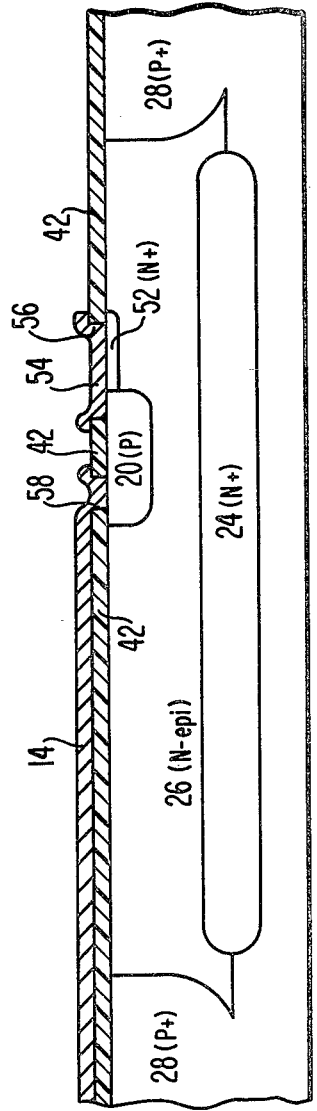
FIG. 3B is a sectional view of the dual polarity transient protection structure taken along lines B—B of FIG. 3.
Figure 3C:
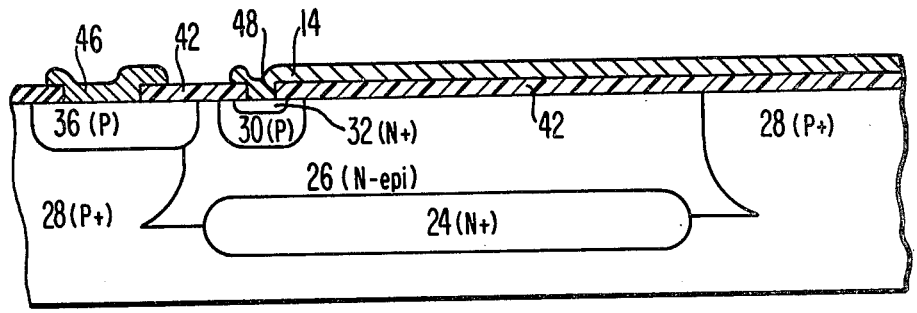
FIG. 3C is a sectional view of the dual polarity transient protection structure taken along lines C—C of FIG. 3.
Figure 3D:
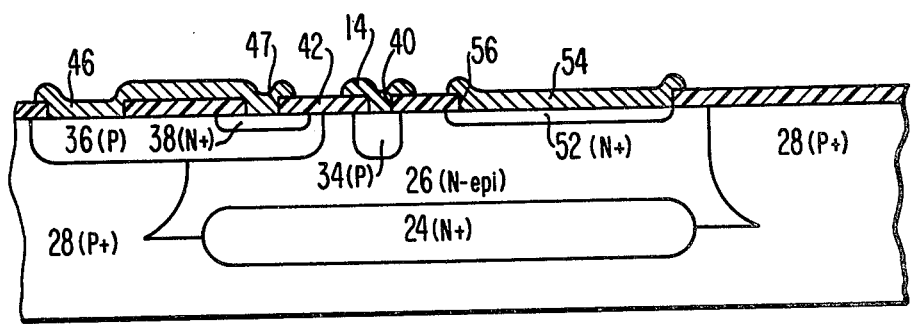
FIG. 3D is a sectional view of the dual polarity transistor protection structure taken along lines D—D of FIG. 3.

Referring now to FIGS. 3 and 3A, 3D it will be seen how the positive transient protection SCR 12 (FIGS. 1 and 2) consisting of PNP transistor $Q_1$ and NPN transistor $Q_2$ are interconnected. In FIGS. 3A and 3D, P region 34 is the emitter, N− region 26 is the base and P region 36 is the collector and represents the elements of PNP transistor $Q_1$. Similarly, NPN transistor $Q_2$ is seen in FIGS. 3A and 3D where N+ region 38 is the emitter, P region 36 is the base and N− region 26 is the collector. Thus, since N− region 26 is common to the base of transistor $Q_1$ and the collector of transistor $Q_2$ they are electrically connected. Similarly, since P region 36 is common to both the collector of transistor $Q_1$ and the base of transistor $Q_2$ these elements are interconnected. To complete the connections for the positive transient SCR, the emitter of transistor $Q_1$ is connected to bond pad 14 through contact opening 40 while the emitter of transistor $Q_2$ is connected to ground metallization 46 through contact opening 47.

N+ pocket region 24 forms a low resistance interconnect for the common connection between the bases of transistors $Q_1$ and $Q_3$ together with the collectors of transistors $Q_2$ and $Q_4$ and makes electrical contact with N− epi layer 26. These connections, just recited, will complete the device shown in FIG. 1.

For the embodiment of FIG. 2, an additional P diffusion 20 is provided between bond pad 14 and the output connection metallization 54. In this latter embodiment, as shown in FIGS. 3, 3B, and 3D, the emitter of transistor $Q_1$ and the emitter of transistor $Q_4$ are connected to bond pad 14 which is connected to one side of P region 20 through contact opening 58. P diffusion 20 represents sense resistor 20 (FIG. 2). N+ pocket region 24, the common connection of the base of transistor $Q_1$, the collector of transistor $Q_2$ as well as the base of transistor $Q_3$ and the collector of transistor $Q_4$ are connected to P diffusion 20 (the other end of sense resistor 20) via N+ diffusion region 52 and metallization 54. Connection to the circuit being protected is made via metallization 54 through opening 56.

To complete the description of my novel structure it will be seen that diode 22 is formed between N diffusion 52 and P+ isolation 28 (FIG. 3B) while resistor 18 is formed in P region 36 between the metallization contact 46 and the portion of P region 36 located between N+ region 38 and N− epi region 26.

Thus, I have described one embodiment of a novel semiconductor structur wherein both negative and positive transient protection is provided in a single, isolated region, together with a bond pad to conserve chip space. In another embodiment, a sense resistor is also included.

What I claim is:

1. A protection circuit for protecting integrated circuit devices against voltage transients, comprising:
   a terminal;
   a sole source of reference potential;
   conductive means for connecting the terminal to the integrated circuit to be protected;
   first circuit connected between the conductive means and the sole source of reference potential for protecting the integrated circuit against negative voltage transients;
   second circuit means connected between the conductive means and the sole source of reference potential for protecting the integrated circuit against positive voltage transients; and
   both the terminal and conductive means formed on and both the first and second circuit means formed within a single isolated region in a semiconductor body.

2. The protection circuit of claim 1, wherein the first circuit means comprises:
   a first NPN transistor having an emitter, a base and a collector;
   a first PNP transistor having an emitter, a base and a collector;
   means connecting the base of the NPN transistor to the collector of the PNP transistor;
   means connecting the base of the PNP transistor to the collector of the NPN transistor;
   means connecting the emitter of the NPN transistor to the conductive means; and
   means connecting the emitter of the PNP transistor to the source of reference potential.

3. The protection circuit of claim 2, wherein the second circuit means comprises:
   a second PNP transistor having an emitter, a base and a collector;
   a second NPN transistor having an emitter, a base and a collector;
   means connecting the base of the second NPN transistor to the collector of the second PNP transistor and to the source of reference potential;
   means connecting the collector of the second NPN transistor to the base of the first and second PNP transistors;
   means connecting the emitter of the second PNP transistor to the conductive means; and
   means connecting the emitter of the second NPN transistor to the source of reference potential.

4. The protection circuit of claim 3, further comprising:

a sense resistor connected in series with the conductive means between the terminal and the protected integrated circuit;

the emitter of the first NPN transistor and the emitter of the second PNP transistor connected to the end of the sense resistor connected to the terminal; and the bases of the first and second PNP transistors and the collectors of the first and second NPN transistors connected to the other end of the sense resistor.

5. A semiconductor structure for protecting an integrated circuit from negative and positive going transients, comprising:

a substrate of semiconductor material of a first conductivity type;

a region of second conductivity type in the substrate at the surface thereof, a first pair of opposite conductivity type transistors, formed in the second conductivity type region, for negative transient protection;

a second pair of opposite conductivity type transistors, also formed in the second conductivity type region, for positive transient protection;

a terminal formed on the surface of the substrate;

conductive means connecting the terminal to the integrated circuit;

a source of reference potential; and the first and second pairs of transistors connected between the conductive means and the source of reference potential.

6. The semiconductor structure of claim 5, wherein the first pair of transistors comprises:

a first NPN transistor and a first PNP transistor each having an emitter, a base and a collector;

the base of the first NPN transistor connected to the collector of the first PNP transistor;

the base of the first PNP transistor connected to the collector of the first NPN transistor;

the emitter of the first NPN transistor connected to the conductive means; and the emitter of the first PNP transistor connected to the source of reference potential.

7. The semiconductor structure of claim 6, wherein the second pair of transistors comprises:

a second NPN transistor and a seoond PNP transistor, each having an emitter, a base and a collector;

the base of the second NPN transistor connected to the collector of the second PNP transistor and to the source of reference potential;

the collector of the second NPN transistor connected to the base of the first and the base of the second PNP transistors;

the emitter of the second PNP transistor connected to the conductive means. and the emitter of the second NPN transistor connected to the source of reference potential.

8. The protection circuit of claim 7, further comprising:

a sense resistor connected in series with the conductive means between the terminal and the protected integrated circuit;

the emitter of the first NPN transistor and the emitter of the second PNP transistor connected to the end of the sense resistor connected to the terminal; and the bases of the first and second PNP transistors and the collectors of the first and second NPN transistors connected to the other end of the sense resistor.

* * * * *

UNITED STATES PATENT AND TRADEMARK OFFICE
CERTIFICATE OF CORRECTION

PATENT NO. : 4,484,244
DATED : November 20, 1984
INVENTOR(S) : Leslie Ronald Avery It is certified that error appears in the above-identified patent and that said Letters Patent is hereby corrected as shown below:

Column 1, line 57, "compementary" should be --complementary--.

Column 6, line 11, "structur" should be --structure--.

Column 6, line 23, after "circuit" insert --means--.

Column 8, line 11, "seoond" should be --second--.

Column 8, line 20, "." after means should be --;--.

Signed and Sealed this

Ninth Day of April 1985

[SEAL]

Attest:

DONALD J. QUIGG

Attesting Officer     Acting Commissioner of Patents and Trademarks